(12) United States Patent
Ortet

(10) Patent No.: US 9,046,567 B2
(45) Date of Patent: Jun. 2, 2015

(54) EQUIPMENT BURN-IN METHOD AND SYSTEM

(75) Inventor: Stephane Ortet, Mondonville (FR)

(73) Assignee: AIRBUS OPERATIONS S.A.S., Toulouse (FR)

( * ) Notice: Subject to any disclaimer, the term of this patent is extended or adjusted under 35 U.S.C. 154(b) by 329 days.

(21) Appl. No.: 13/001,753

(22) PCT Filed: Jun. 23, 2009

(86) PCT No.: PCT/FR2009/051202
§ 371 (c)(1),
(2), (4) Date: Mar. 31, 2011

(87) PCT Pub. No.: WO2010/004165
PCT Pub. Date: Jan. 14, 2010

(65) Prior Publication Data
US 2011/0169514 A1  Jul. 14, 2011

(30) Foreign Application Priority Data

Jun. 30, 2008 (FR) ...................... 08 54374

(51) Int. Cl.
*G01R 31/10* (2006.01)
*G01R 31/28* (2006.01)
(52) U.S. Cl.
CPC ................. *G01R 31/2849* (2013.01)
(58) Field of Classification Search
CPC ................................. G01R 1/0491
USPC .............. 324/750.05, 755, 760, 537, 750.06
See application file for complete search history.

(56) References Cited

U.S. PATENT DOCUMENTS

| | | | | |
|---|---|---|---|---|
| 4,855,672 A * | 8/1989 | Shreeve | ................... | 324/750.05 |
| 5,543,727 A * | 8/1996 | Bushard et al. | .......... | 324/750.08 |
| 5,744,975 A * | 4/1998 | Notohardjono et al. | . | 324/750.05 |
| 5,819,208 A | 10/1998 | Carter | | |
| 6,663,278 B1 * | 12/2003 | Chien et al. | ...................... | 374/43 |
| 8,068,524 B1 * | 11/2011 | Patel et al. | ...................... | 372/34 |
| 8,425,287 B2 * | 4/2013 | Wexler | .......................... | 454/184 |
| 2002/0075024 A1 | 6/2002 | Fredeman et al. | | |
| 2003/0037193 A1 | 2/2003 | Larson et al. | | |
| 2006/0045796 A1 * | 3/2006 | Anderle et al. | ................... | 422/3 |
| 2006/0097337 A1 * | 5/2006 | Haji-Sheikh et al. | ......... | 257/462 |
| 2006/0259203 A1 | 11/2006 | Cheemalapati et al. | | |
| 2010/0141287 A1 * | 6/2010 | Scocchetti | .................... | 324/755 |
| 2012/0306408 A1 * | 12/2012 | Chung et al. | .................. | 315/307 |

OTHER PUBLICATIONS

International Search Report issued Nov. 13, 2009, in PCT/FR2009/051202 with English translation.
Charles E. Harm., "Real World Application of Burn-in to Improve Product Quality", Institute of Electrical and Electronics Engineers, vol. CONF. 13, XP-010040411, Nov. 5, 1991, pp. 560-565.

\* cited by examiner

*Primary Examiner* — Tung X Nguyen
*Assistant Examiner* — Giovanni Astacio-Oquendo
(74) *Attorney, Agent, or Firm* — Oblon, McClelland, Maier & Neustadt, L.L.P.

(57) ABSTRACT

An equipment burn-in method, which includes the equipment undergoing treatment in an oven, the oven undergoing cycles including at least one temperature-rise and/or temperature-fall transition, for which ventilation of the equipment is cut off during at least part of a temperature transition of the oven.

10 Claims, 2 Drawing Sheets

EQUIPMENT BURN-IN METHOD AND SYSTEM

Figure 1:
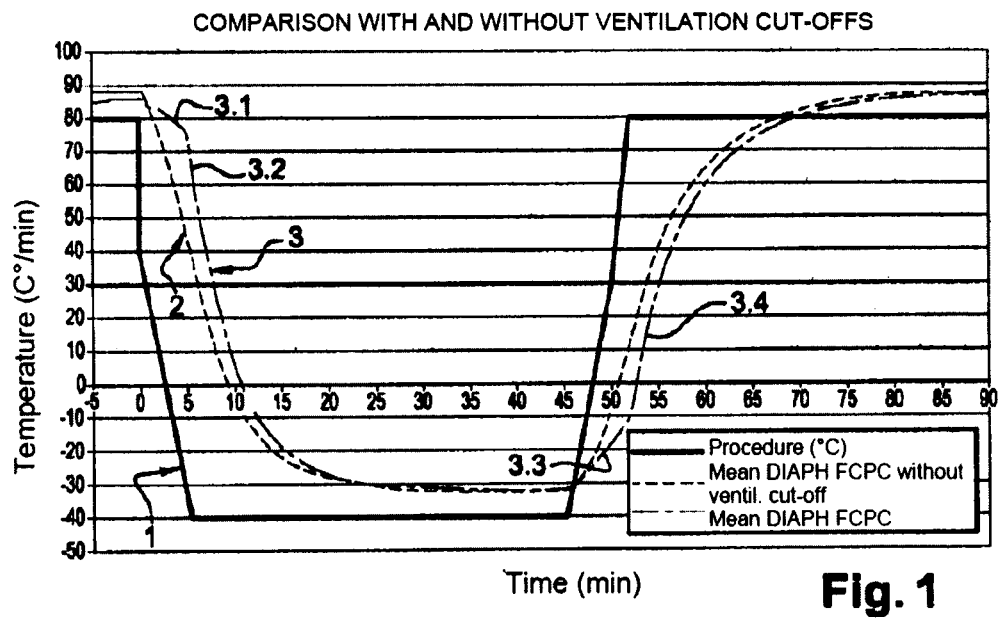

This invention relates to a system and a method for burn-in of equipment items such as electronic equipment items and in particular avionic equipment items.

The purpose of burn-in is to precipitate latent failures of a system in the production phase. In the electronics field, failures take place essentially at the components (including printed circuit) of the welds and the transfer of the components onto the printed circuits.

Burn-in may concern several physical phenomena—vibration burn-in, resistance to impacts, temperature burn-in, etc. This invention concerns temperature burn-in by thermal cycling.

One of the preponderant factors in the efficacy of burn-in by thermal cycling is the speed of temperature variation during temperature changes. This speed of variation must be effective on the internal components making up the equipment items.

The state of the art consists in using high-performance ovens to apply rapid temperature variations to the equipment.

Stated simply, an oven is a closed isothermal enclosure accommodating a heating system and a cooling system. The heating system usually is based on electrical resistances.

The cooling system may be of two types: a refrigerating machine comprising a cold unit, an evaporator and a condenser or a system based on injection of liquid nitrogen into the oven with gasification of the nitrogen in the oven.

For ovens referred to as RTV (Rapid Temperature Variation), the variation speed values may range from 10° C./min, while a standard oven has variations of 2° C./min, up to 60° C./min for very specific machines.

But the problem is that it is not possible to apply these temperature variations directly to the elements making up the equipment.

In fact, the temperature variations of the oven are passed on to the equipment through exchange of calories between the air of the oven and the equipment.

In principle, therefore, for there to be heat exchange, it is necessary for the air that surrounds the equipment to be at a temperature different from the equipment. The more disparity there is, the greater the heat exchange. The second physical phenomenon is the thermal inertia of the equipment which counters temperature variations by storing calories.

These two phenomena combined means that there is a delay between the temperature variation of the oven and that of the equipment and a damping of the variation gradients.

Therefore, for a given oven, for a given temperature variation speed, the greater the inertia of the equipment and the less significant the heat exchange and the lower the temperature variation speed of the equipment will be.

In order to improve observance of the temperature variation speeds at the equipment, it is necessary to improve the heat exchange and three solutions traditionally are used.

First, it is known to place the electronic boards directly in contact with the air of the oven which makes it necessary to partially dismantle the equipment in order to expose the boards.

This has two advantages: reducing the thermal inertia of the equipment and favoring the heat exchange of the boards.

Then if the equipment is ventilated, it is known to increase the ventilation. The sole advantage of this solution is to favor the heat exchange between the air and the electronic boards or the equipment.

Finally, the third solution is to use ovens with a significant temperature variation capacity much greater than the variation speed that it is desired to obtain at the board or the equipment.

These three solutions may be combined, but it remains that even with a full heat exchange, the elements making up the equipment can only follow the temperature of the oven.

The temperature variation speed that can be attained, therefore, is less than or equal to the variation speed of the oven. In reality, a significant disparity exists and the oven must be markedly oversized.

Moreover, since burn-in is performed at the end of the manufacturing process for the equipment, the latter is completely assembled, which does not facilitate the heat exchange which takes place essentially by convection at the electronic boards in the housing of the equipment.

It is known to open up or take apart the equipment in order to place the electronic boards directly in contact with the air of the oven, but this brings about a significant additional cost linked to the operation of taking apart/reassembly and comprises risks associated with damage to the electronic boards during manipulations. That also has a logistic impact.

If the ventilation flow is increased, the effect on the temperature variations at the equipment all the same remains far below the oven procedure.

The use of specific ovens in which liquid nitrogen is used to produce cold necessarily involves exposure of the electronic boards in order to achieve a correct heat exchange.

Beyond the impact on the manufacturing process, the purchasing and operating costs linked to the substantial consumption of nitrogen by these ovens are a major drawback.

This invention is intended to offer a simplified means in comparison with the prior art for increasing temperature variation speeds while retaining a simple burn-in process reducing or even nullifying the needs for dismantling the equipment items being tested.

The invention is based on a principle that amounts to suspending the time during transitions, passage from hot to cold and vice versa, so that from the equipment standpoint the transition is instantaneous.

For this purpose, this invention provides a method for burn-in of an equipment item comprising a step of run-through of the equipment in an oven with cycles comprising at least one temperature-rise and/or temperature-fall transition of the oven for which ventilation of the equipment is cut off for at least a part of a temperature transition of the oven.

Ventilation of the equipment advantageously is restarted at the end of the said transition.

Unventilated, the equipment has few exchanges with the oven, which allows the latter the time to make its transition. In this way, when the ventilation is restarted, the equipment is traversed by the air at a temperature already having varied while the temperature of the equipment has varied very little.

The ventilation advantageously is restarted at a flow exceeding the rated ventilation flow of the equipment so as to force ventilation of the equipment.

According to a first embodiment, the cycle has at least one hot level. In this case, the hot level preferably is at a temperature on the order of 80° C.

According to an alternative or additional embodiment, the cycle has at least one cold level. In this case, the cold level preferably is at a temperature on the order of −40° C.

Starting from the hot level, the ventilation advantageously is cut off prior to the beginning of the fall and the cut-off is extended until a maximum disparity between the temperature of the oven and that of the equipment is achieved.

Starting from the cold level, the ventilation advantageously is cut off prior to the renewed rise and the cut-off is extended until a maximum disparity between the temperature of the oven and that of the equipment is achieved.

In the latter case, the electrical supply of the equipment preferably is cut off prior to and during the beginning of the renewed rise in order to avoid temperature rise inside the equipment in operation.

Still according to the invention, for partial fillings of the oven, an oven procedure equal to the maximal performance attained when the oven is full advantageously is applied for the transitions.

Figure 2:
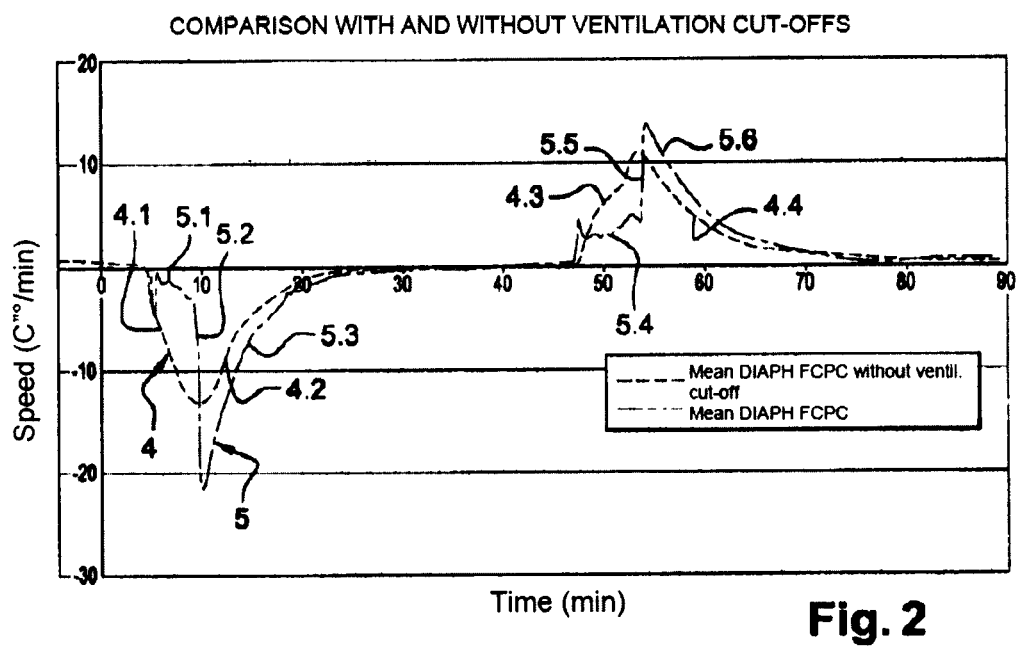
Figure 3:
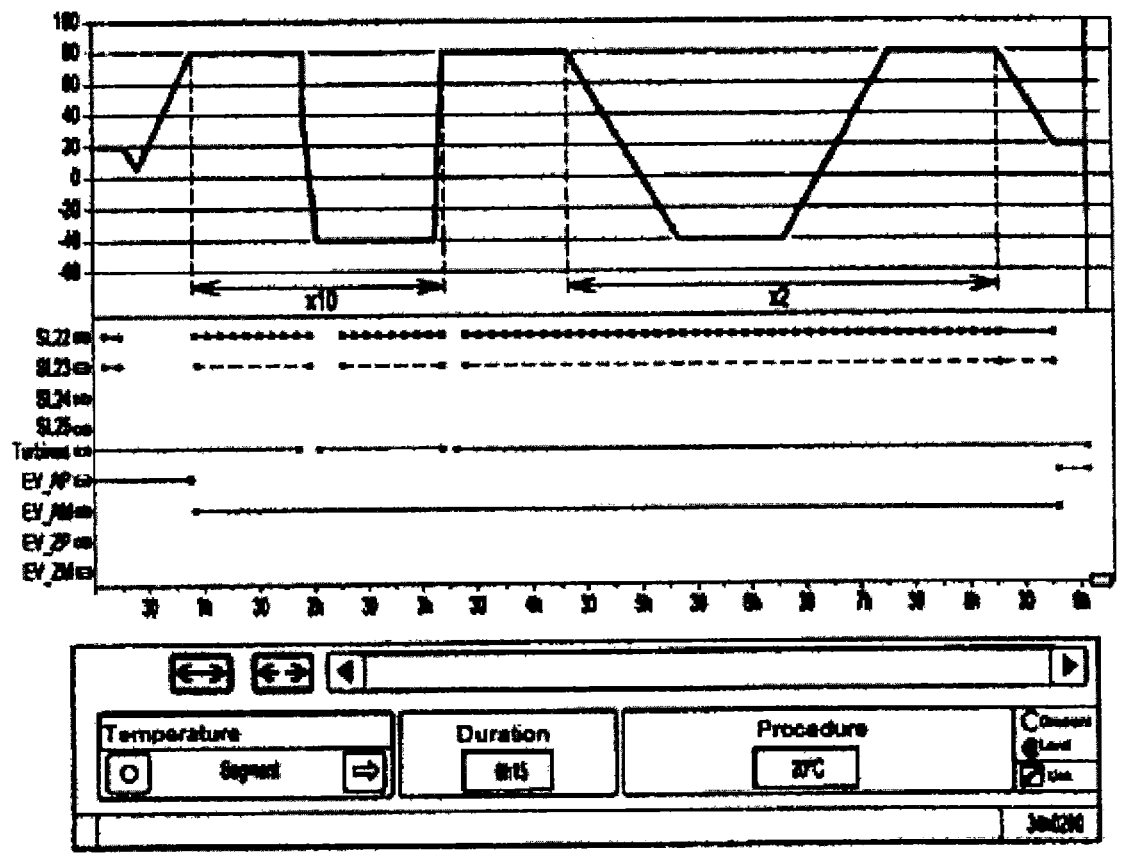
Figure 4:
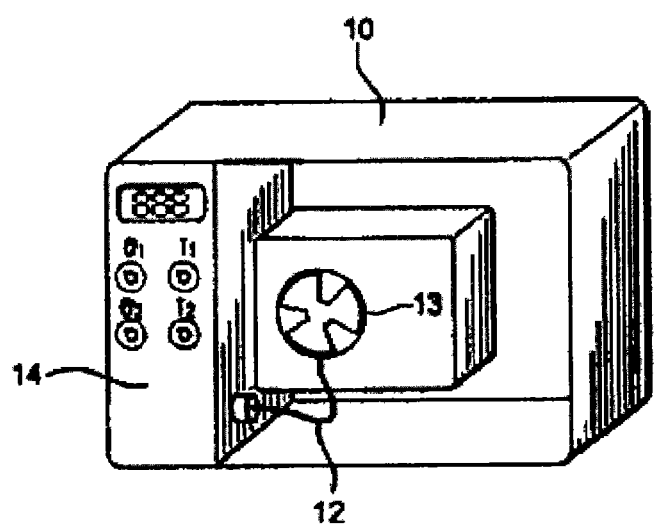

Other characteristics and advantages of the invention will be apparent on reading of the description that follows, accompanied by Figures that show:

on FIG. 1: a first graph showing the temperature variations according to time providing a comparison of temperature rises and falls with and without ventilation cut-off;

on FIG. 2: a second graph showing temperature variation speeds according to time and showing temperature gradient variations with and without ventilation cut-off;

on FIG. 3: a third graph showing an exemplary burn-in process with multiple cycles of temperature rise and fall;

on FIG. 4: a schematic representation of an oven in which an equipment item to be tested is disposed.

The invention applies to the burn-in of electronic boards or equipment items by thermal cycling.

FIG. 4 shows an oven 10 in the context of the method according to the invention equipped with a control circuit 12 connected to ventilation 13 for the equipment.

The control circuit operates ventilation 13 according to the cycling procedures of the oven and is driven by a regulator 14 that comprises the cycling procedures.

The RTV burn-in cycles have at least one hot level and one cold level. In the case of civil aviation equipment items, cycles with rises to 80° C. and falls to −40° C. are standard and the examples given for the invention are seen in this context.

FIG. 1 shows the graph of temperature variation according to time. Shown on this Figure are:

in a solid line, the procedural temperature of oven 1,
in a dotted line, the temperature of the equipment without ventilation cut-off 2 as in the prior art and,
in a mixed line, the temperature of the equipment with ventilation cut-off 3.

According to the invention, that is to say with cut-off of the ventilation, starting from the hot level, or for times from −5 to 0 minute in the example of FIG. 1, the ventilation of the equipment is cut off prior to the beginning of the temperature fall.

The temperature fall of the oven reference 1 on FIG. 1 takes place in a time on the order of 5 minutes.

The duration of cut-off of the ventilation is going to be regulated according to the speed of fall of the oven and the inertia of the equipment that is shown on curve 3 for which a first reduced temperature fall gradient 3.1 is visible at the top of the curve. In fact, although unventilated, the equipment falls in temperature.

The restarting of the ventilation is implemented when the disparity between the temperature of the oven and that of the equipment is maximum, which corresponds to the flex between segments 3.1 and 3.2 of curve 3.

When the ventilation is restarted, the temperature of the equipment drops very rapidly with a more significant gradient than for curve 2 for which ventilation of the equipment remained in operation.

The gradient then comprises a very steep part over a major portion of segment 3.2 and is close to the transition gradient of the empty oven.

During the renewed rise, after 45 minutes, the ventilation is cut off at the beginning of the transition.

A slight renewed rise 3.3 is seen during the cut-off of ventilation, then a curve with a marked gradient 3.4 during restarting of this ventilation.

In this case it furthermore is advantageous to no longer energize the equipment prior to and during the beginning of the renewed rise in order to avoid internal temperature rise thereof, caused by the thermal dissipation of the electronic components when they are energized, which reduces or even eliminates renewed rise 3.3.

In fact, at −40° C. oven temperature, the components of the equipment are hotter because this equipment is dissipating energy.

Cutting off the energizing of the equipment while ventilating it brings its temperature back to −40° C.

A final point to be verified is the reproducibility of the burn-in. In fact, the performance of the oven is according to its load. This load varies according to the production rate of the equipment items. The solution in order to ensure an appropriate reproducibility irrespective of the load of the oven is to apply an oven procedure (in rises and falls) equal to the maximal performance attained when the oven is full. When the oven is practically empty, it will follow the same procedure as if it was full.

The oven used, for example, is specified for attaining temperature variations of 20° C./minute empty.

It is noted that when ventilation of the equipment is under way during falls and rises in temperature, curve 2 for fall and respectively for rise has a gradient on the order of half to a quarter of the gradient for the procedure of the oven.

When the ventilation is cut off, curve 3, a delay is introduced but the gradient is much steeper and, apart from its asymptotic parts, is close to the procedural curve.

The curves correspond to the mean value of the temperatures within the equipment.

The effect of the method of the invention on the temperature variations of the components thus is observed. The time lag linked to the shutdown of the ventilation which makes it possible to make the gradients steeper also may be noted.

The graph of FIG. 2 shows temperature variation speeds according to time, curve 4, in a dotted line for the equipment for which ventilation remains in operation and, curve 5, in a mixed line, for the equipment for which ventilation is shut down during transitions.

On this graph, the delays caused by the shutdown of ventilation are particularly shown in parts of curves 5.1 and 5.4. The restarting of ventilation is shown by the abrupt variations of parts 5.2 and 5.5 of curve 5.

On the contrary, on curve 4 for the equipment for which ventilation is maintained, the temperature change speed variations of the equipment are smaller and more damped, the times during which the temperature varies are practically doubled while the maximal variation rates are practically divided by two.

In this way the method of the invention makes it possible to better pass on the temperature variations generated by the oven to the devices being tested without any additional cost other than the ventilation control for the equipment.

Therefore for the same stress level, which depends on the temperature variation speed, applied to the equipment, a less high-performance oven, thus with a significantly lower price, may be used.

Conversely, with a high-performance oven, there may be applied greater stresses that may be equivalent to those that would be applied with the highest-performing ovens on the current market without using the invention.

If a concrete case of implementation is considered, in which it is necessary to apply temperature variations of 20° C./min to the equipment items, as in the cycling example known from FIG. 3, the method of the invention makes it possible to use standard ovens at 20° C./min without dismantling the equipment.

There is therefore an optimization of the use of the oven since it then is not necessary to use a higher-performance oven.

In order to further improve the variation speed, when the ventilation is restarted it is necessary to do so significantly.

The invention is not limited to the example shown and in particular is applicable to cycles comprising different temperature thresholds.

The invention claimed is:

1. A method for burn-in of an equipment item including ventilation, comprising steps of:
    performing a run-through of the equipment in an oven with cycles comprising at least one of a temperature-rise transition and a temperature-fall transition of the oven;
    cutting off the ventilation for the equipment during at least a part of a temperature transition of the oven to limit heat exchange with the oven; and
    restarting the ventilation for the equipment at an end of the temperature transition such that the equipment is traversed by air in the oven having a temperature that has been varied during the cutting off to increase a temperature change speed of the equipment.

2. The method for burn-in according to claim 1, further comprising restarting the ventilation at a flow exceeding a rated ventilation flow of the equipment so as to force ventilation of the equipment.

3. The method for burn-in according to claim 1, wherein the cycles include at least one hot level cycle.

4. The method for burn-in according to claim 3, wherein the hot level cycle is at a temperature on an order of 80° C.

5. The method for burn-in according to claim 3, wherein, starting from the hot level cycle, the ventilation is cut off prior to a beginning of a temperature fall and the cut off is extended until a maximum disparity between a temperature of the oven and a temperature of the equipment is achieved.

6. The method for burn-in according to claim 1, wherein the cycles include includes at least one cold level cycle.

7. The method for burn-in according to claim 6, wherein the cold level cycle is at a temperature on an order of −40° C.

8. The method for burn-in according to claim 6, wherein, starting from the cold level cycle, the ventilation is cut off prior to a renewed temperature rise and the cut off is extended until a maximum disparity between a temperature of the oven and a temperature of the equipment is achieved.

9. The method for burn-in according to claim 6, wherein an electrical supply for the equipment is cut off prior to and during a beginning of a renewed temperature rise to avoid temperature rise inside the equipment.

10. The method for burn-in according to claim 1, wherein ventilation of the equipment is driven by a regulator that includes temperature cycling procedures of the oven.

* * * * *